United States Patent [19]
Tokoro

[11] Patent Number: 5,319,212
[45] Date of Patent: Jun. 7, 1994

[54] METHOD OF MONITORING ION BEAM CURRENT IN ION IMPLANTATION APPARATUS FOR USE IN MANUFACTURING SEMICONDUCTORS

[75] Inventor: Nobuhiro Tokoro, West Newbury, Mass.

[73] Assignee: Genus, Inc., Mountain View, Calif.

[21] Appl. No.: 958,077

[22] Filed: Oct. 7, 1992

[51] Int. Cl.⁵ .......................................... H01J 37/317
[52] U.S. Cl. .......................... 250/492.21; 250/397
[58] Field of Search ................. 250/397, 398, 492.21

[56] References Cited

U.S. PATENT DOCUMENTS

| | | | |
|---|---|---|---|
| 4,118,630 | 10/1978 | McKenna et al. | 250/397 |
| 4,234,797 | 11/1980 | Ryding | 250/492 B |
| 4,357,536 | 11/1982 | Varma et al. | 250/397 |
| 4,539,217 | 9/1985 | Farley | 427/10 |
| 4,717,829 | 1/1988 | Turner | 250/492.21 |
| 4,849,641 | 7/1989 | Berkowitz | 250/397 |
| 5,180,918 | 1/1993 | Isobe | 250/397 |

*Primary Examiner*—Bruce C. Anderson
*Attorney, Agent, or Firm*—Nields & Lemack

[57] ABSTRACT

In ion implantation apparatus, a pair of electrodes is positioned about the ion beam near the place where ions strike the target in which they are implanted. One electrode has a positive potential applied to it, and the electron current collected at this electrode is measured. The other electrode has a negative potential applied to it, and the positive ion current collected at this electrode is separately measured. The magnitude of the two currents are added together and used as a signal to compensate for reduction in beam current collected caused by charge exchange phenomena.

4 Claims, 3 Drawing Sheets

METHOD OF MONITORING ION BEAM CURRENT IN ION IMPLANTATION APPARATUS FOR USE IN MANUFACTURING SEMICONDUCTORS

BACKGROUND OF THE INVENTION

1. Field of the Invention

This invention relates to ion implantation apparatus for use in manufacturing semiconductors.

2. Description of the Prior Art

In ion implantation apparatus for use in manufacturing semiconductors, the impurities which are introduced into the silicon or gallium arsenide target are ionized in an ion source, extracted in the form of a beam, accelerated to a certain energy, and implanted into the target. At this time the concentration of impurity which is introduced into the target can be established exactly by measuring the current of the ion beam using a Faraday cup, and seeking, as the dose amount, the total number of particles of ions shown by the total of this current. In FIGS. 1 and 2 are shown, by way of example, a method of measuring ion beam current which is widely used at the present time in ion implantation apparatus. In the example shown in FIG. 1, the substrate (which may be a wafer) 1 is placed at the bottom of a Faraday cup 4, and the current in the incident ion beam 2 is measured by the current meter 5 which is connected to the Faraday cup 4. At this time a secondary electron suppressor 3, to which a negative voltage is applied from a suitable negative voltage power supply 6, is provided at the entrance of the Faraday cup 4 and prevents escape from the inside of the cup of the secondary electrons produced within the cup, thereby resulting in a tool which greatly reduces measurement errors. The example shown in FIG. 2 is a method disclosed in U.S. Pat. No. 4,234,797, wherein the substrates (or wafers) 12 are mounted on a disk 11 rotating at high speed. When the ion beam 13 passes through a slit 18 provided in this disk 11, the current is measured by a Faraday cup 15 provided behind the disk 11. As in the case of the example shown in FIG. 1, a current meter 16 is connected to the Faraday cup 15, and a secondary electron suppressor 14, to which a negative voltage is applied from a suitable negative voltage power supply 17, is provided at the entrance of the Faraday cup 15.

However, on substrates used in manufacturing semiconductor devices used in actual ion implantation apparatus, there are many cases in which photoresist is applied as a mask material. When the ions being implanted pass through this photoresist mask, part of the energy of the ions strikes the polymer forming the photoresist material, the molecular bonds thereof are broken, and hydrogen molecules ($H_2$), nitrogen molecules ($N_2$), carbon monoxide (CO), water ($H_2O$), carbon (C), nitrogen (N) etc. are released into the process chamber as outgases. The amount of gas released varies, depending upon the type of photoresist material, film thickness, energy and current of the ion beam, etc., but in the case of apparatus furnished with usual pumping speed, the vacuum in the process chamber can be $10^{-4}$ – $10^{-3}$ Torr, which is even 2-3 orders of magnitude worse than normal vacuum. In this manner, in cases where the vacuum has become very much worse, the ions of the incident ion beam collide with these residual gases, some are neutralized, some lose electrons, and their charge state is changed, and the disadvantage results that the dosage amount can no longer be monitored exactly. Moreover, together with this disadvantage, large size, multi-unit vacuum pumps are introduced to increase pumping speed, and the increased size of the apparatus, and greater cost, invite further disadvantages. Again, if one compensates the beam current based upon the vacuum of the process chamber as described in U.S. Pat. No. 4,539,217, it is necessary to carry out vast numbers of preliminary tests concerning all related ion species, energy, gas species, and vacuum; and even if one does these tests provisionally, in actual fact the photoresist structure during ion implantation may be changed by radiation of the ions from time to time and moment by moment, and the vacuum in the process chamber, as well as the structure of the residual gases, may also change from time to time and moment by moment, so that it is very difficult to compensate exactly. This invention has the objective of overcoming these defects, and to provide a method of monitoring ion beam current which is practical and successful.

SUMMARY OF THE INVENTION

In order to achieve the aforesaid objective, the method of monitoring ion beam current according to this invention is characterized by using two electrodes arranged opposite one another so as to hold therebetween the ion beam at the front surface of the target substance within the process chamber, simultaneously collecting the secondary electrons and secondary ions which are produced by collisions between the ion beam and residual gases, and, by measuring this electric current, quantitatively monitoring the changes in charge state (neutralization, electron loss) of the incident ion beam, and, even when the vacuum of the process chamber has changed, compensating the incident ion beam current, and being able to measure exactly the number of particles of incident ions.

By measuring the current of secondary electrons and secondary ions produced by collisions between incident ions and residual gases in the process chamber, one can control the dosage amount exactly, even if the vacuum in the process chamber changes.

BRIEF DESCRIPTION OF THE DRAWINGS

The invention may best be understood from the following detailed description thereof, having reference to the accompanying drawings, in which.

DESCRIPTION OF THE PREFERRED EMBODIMENT

A simple explanation of the measurement principles of this invention now will be given.

The collisional processes of atoms and molecules with the ion beam, in the range of ion beam energies between keV and MeV, are principally of the following 3 types. Viz., if one designates the incident ion as $A^+$, and the target as $B^\circ$ (1) ionization of target $A+B°\rightarrow A+B^++e$
(2) neutralization of ion $A^++B°\rightarrow A°+B^+$
(3) electron loss of ion $A^++B°\rightarrow A^{++}+B°+e$ The probability that these processes will occur (i.e. the collisional cross-section) depends upon the type and energy of the ions participating in the collision, and the type of target, but generally speaking when the velocity of the ion is slow process (2) predominates, and when the velocity of the ion is very fast process (3) predominates.

As is clear from this, processes which became problems in the prior art methods are (2) and (3). However, in these if one measures the current amount of the secondary ions $B^+$ and secondary electrons e which are produced by collisions and adds them up, one can ascertain from the remaining electric charge how the electric charge of the incident ions has changed. This is because the simple ionization of the targets is not influenced at all by the normal canceling-out of the amount of electric charge of the ions which are produced and the electrons. In this connection, in this method, even if any number of any kind of collision processes arise in the range of supplemental collection of secondary ions and secondary electrons, no electric charge is destroyed and there is no theoretical problem, but in the worst actual case, assuming a vacuum of $10^{-3}$ Torr, a collisional cross-section of $10^{-15}$ cm$^2$, the mean free path becomes $$L = 1/N \cdot s$$
$$= 1/(3.536 \times 10 + 16 \times 1 \times 10^{-3}) \times 1 \times 10^{-15}$$
$$= 28.3 \text{ cm}$$

and the distance traveled by each ion in the process chamber is everywhere the same degree, and it is expected that the incident ions and the residual gas will collide only once everywhere. An actual example of this invention will now be explained, based upon the drawings in the case realized with prior art example (2) (FIG. 2), but practical application of this invention is not limited to this.

Figure 1:
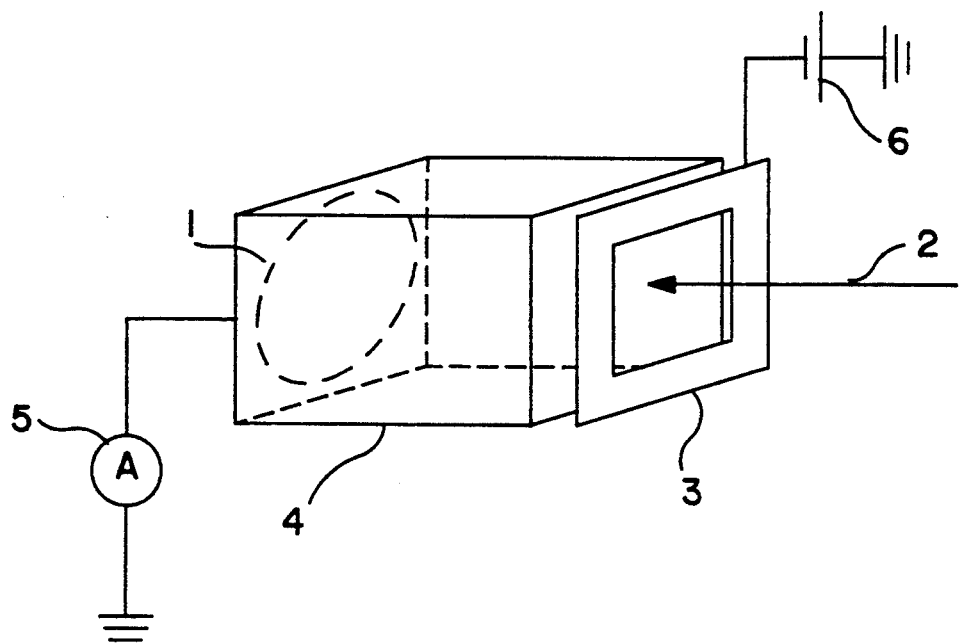
FIG. 1 is a diagrammatic sketch showing one construction of prior art apparatus.
Figure 2:
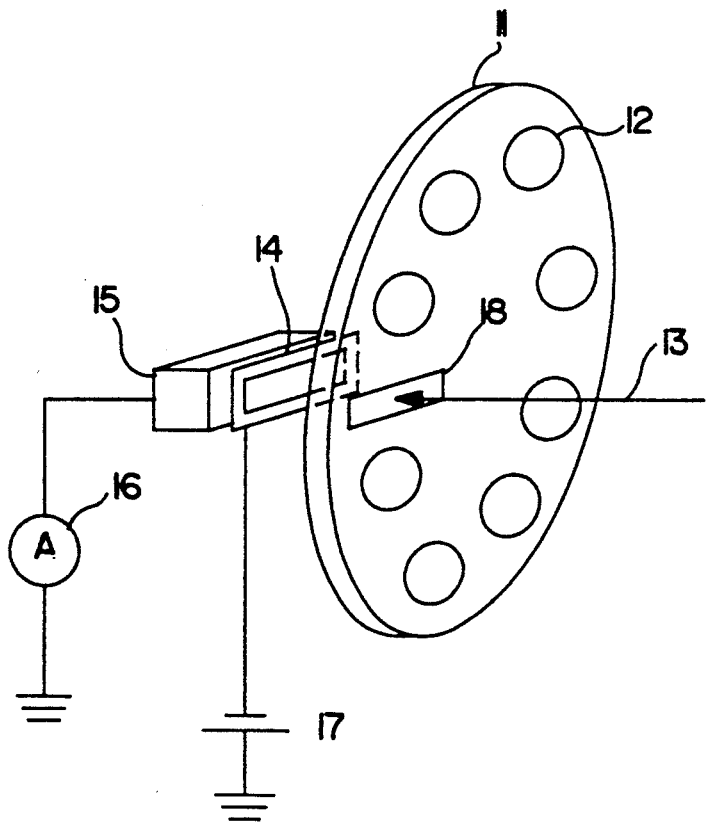
FIG. 2 is a diagrammatic sketch showing another construction of prior art apparatus.
Figure 3:
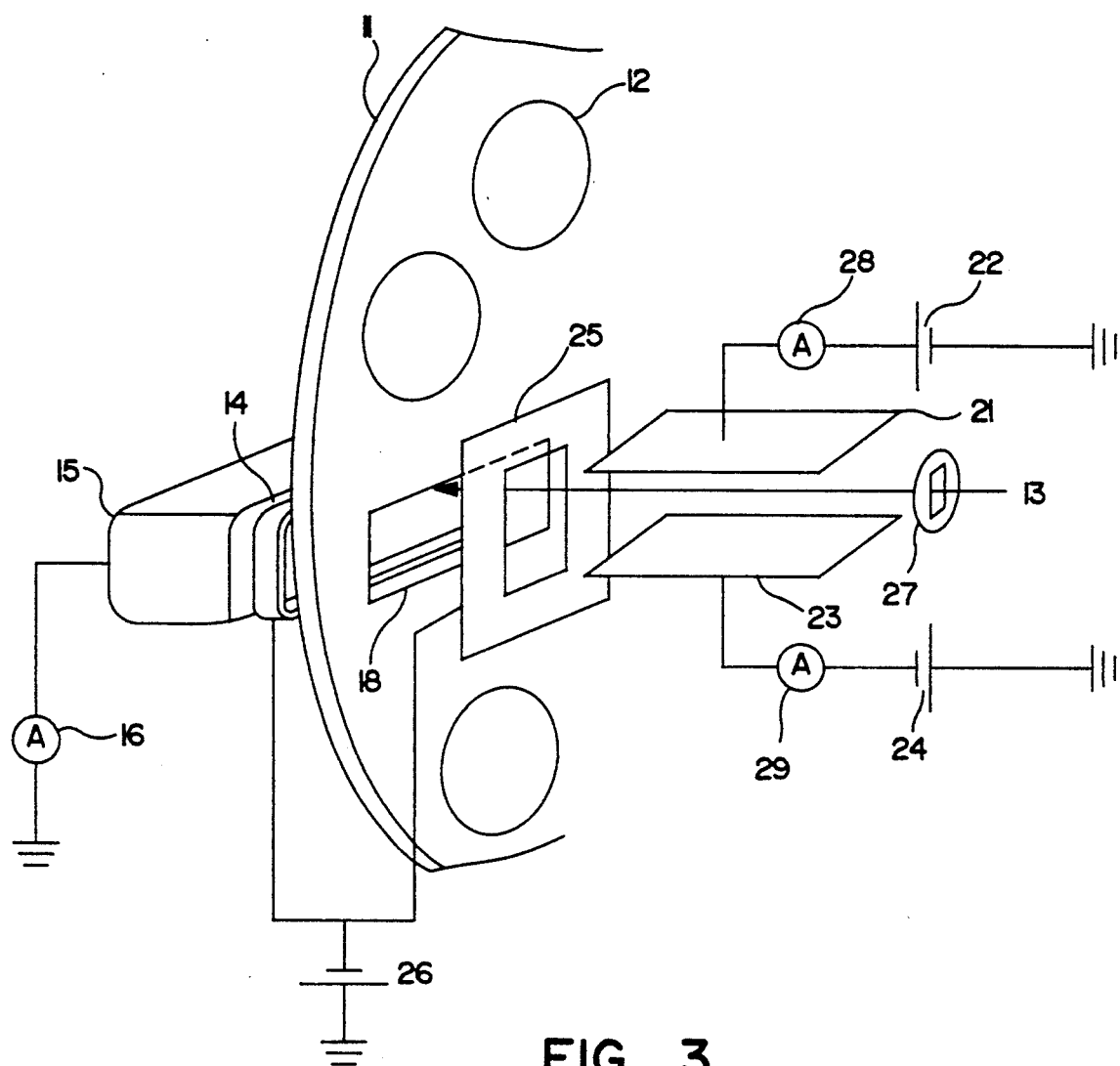
FIG. 3 is a diagrammatric sketch, similar to that of FIG. 2, and showing one construction of apparatus in accordance with the invention.

Referring now to the drawings, and first to FIG. 3 thereof, for the sake of simplicity, there is shown an essential construction which is the same as that of FIG. 2, and the reference numerals are the same as those of FIG. 2. Herein, directly in front of the disk 11 which supports the wafers 12 in the process chamber, there is provided a secondary electron/ion current measuring device comprising a secondary electron collector plate 21 to which +300V is applied from a positive voltage power supplY 22, a secondary ion collector plate 23 to which −300V is applied from a negative voltage power supply 24 and a shield 25 to which −300V is applied from a negative voltage power supply 26. These collector plates cover the region from the front surface of the disk 11 (which worsens the vacuum by influence of outgassing during ion implantation) to a beam-defining aperture 27 which also serves as the differential pumping aperture which is provided at the entrance aperture of the process chamber. When the incident ion beam 13 passes between these collector plates 21, 23, the secondary electrons and secondary ions which are produced by collisions with residual gases are accelerated by the electric field between the collector plates 21, 23 and arrive, respectively, at the secondary electron collector plate 21 and the secondary ion collector plate 23, and are measured by the current meters (or ammeters) 28 and 29 which are connected to the respective collector plates 21 and 23. As this time, a shield 25 which is placed perpendicularly between the disk 11 and the two collector plates 21 and 23, is maintained at the −300V by a separate electric power supply 26, and repels each of the secondary electrons and absorbs each of the secondary ions which arise from collisions between the incident ion beam 13 and the disk 11, and prevents them from causing any influence by arriving at the collector plates 21 and 23. As has also been described in the principles of measurement, because all the electric charge amount which participates in the collisions is preserved, if the amount of electric current of the secondary electrons and secondary ions which are collected in this way are added together, this total electric current amount corresponds to the change in amount of current of the incident ion beam.

Figure 4:
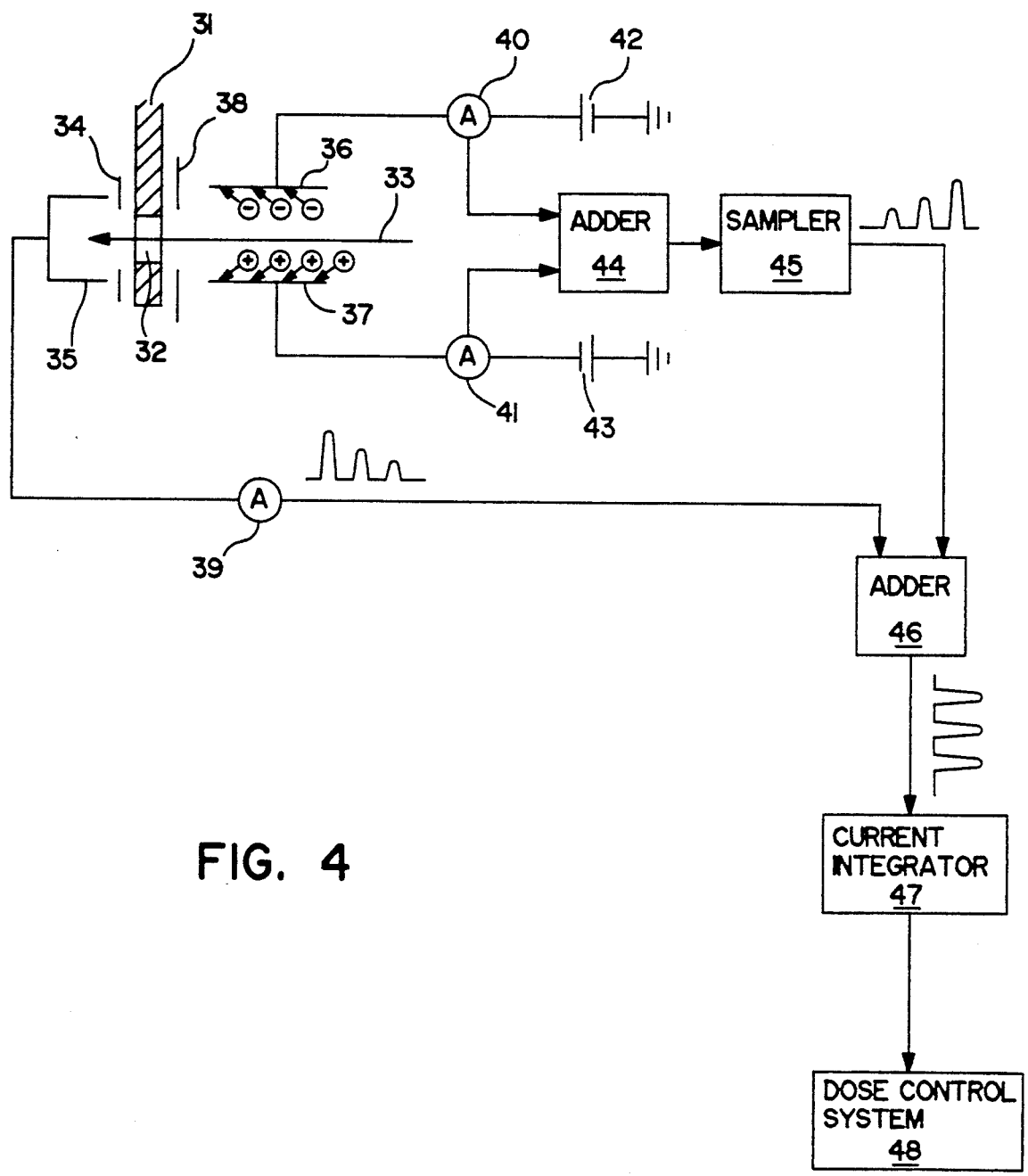
FIG. 4 is a combined diagrammatic sketch and circuit diagram showing an actual method of signal treatment in accordance with the invention.

Next, an actual method of signal treatment is shown in FIG. 4. The ion beam 33, when it passes through the slit 32 provided in the rapidly rotating disk 31, is monitored by a Faraday cup 35 which is provided behind the disk 11. At this time, as shown in the middle of the figure, the current has a pulse form corresponding to the number of rotations. At this time, the quantity of secondary electrons and secondary ions which are produced by collisions between the incident ion beam and the residual gases is measured by the independent ammeters 40 and 41. These measured current amounts are added together by the adder 44, and then sampled by the sampler 45 simultaneously with the signal from the Faraday cup 35. Then this sampled signal and the signal from the Faraday cup 35 are added together in a separate adder 46, and converted to the true current amount corresponding to the number of particles of the incident ions. This signal is thereafter sent to the current integrator 47, and converted into a series of digital pulses corresponding to the amount of electric charge, and used to run the dose control system 48.

As explained hereinabove, by means of this invention, if one collects the secondary electrons and secondary ions which are produced and uses the method of compensating the current amount of the incident ion beam, even in cases where the vacuum in the process chamber changes greatly, without depending upon the type or energy of the incident ions, or the type of residual gas, etc., and without the necessity of any class of preliminary tests, one can ascertain the number of particles of the incident ions exactly.

Having thus disclosed the principles of the invention, together with an illustrative embodiment thereof, it is to be understood that, although specific terms are employed, they are used in a generic and descriptive sense, and not for purposes of limitation, the scope of the invention being set forth in the following claims.

I claim:

1. In ion implantation apparatus for use in manufacturing semiconductors, apparatus for measuring exactly the number of particles of incident ions even when the degree of vacuum changes, comprising in combination two electrodes arranged opposite one another so as to hold therebetween the ion beam at the front surface of the target substance within the process chamber, a shield which repels secondary electrons and absorb secondary ions which arise from collisions between the ion beam and the disk and to prevent them from causing any influence by arriving at said electrodes, means for applying potentials of opposite polarity to said electrodes, means for separately measuring the current collected by said electrodes, means for adding the magnitudes of said currents to form a signal, and means for using said signal to compensate for the change in ion beam current caused by change in the degree of vacuum.

2. In ion implantation apparatus for use in manufacturing semicondcutors, a method of measuring exactly the number of particles of incident ions even when the degree of vacuum changes, comprising the following steps:

using two electrodes arranged opposite one another so as to hold therebetween the ion beam at the front surface of the target substance within the process chamber, shielding said electrodes from secondary electrons and secondary ions which arise from collisions between the ion beam and the target substance, simultaneously collecting the secondary electrons and secondary ions which are produced by collisions between the ion beam and residual gases, and, by measuring this electric current, compensating for the change in ion beam current caused by change in the degree of vacuum.

3. A method for controlling the dose of ions implanted into a workpiece by an ion implanter comprising the steps of measuring the ionized beam current at the workpiece, determining the amount of charge changing in the beam prior to striking the workpiece, adding the ionized beam current and the amount of charge changed beam current to obtain an original ionized beam current, and varying the dose of implantation as a function of the original ionized beam current.

4. A method in accordance with claim 3 for controlling the dose of ions implanted into a workpiece by an ion implanter comprising the steps of measuring the ionized beam current at the workpiece, removing secondary electrons from the beam in the vicinity of the workpiece and measuring the current thereof, removing secondary ions from the beam in the vicinity of the workpiece and measuring the current thereof, and varying the dose of implantation as a function of said three currents.

* * * * *